United States Patent [19]
Kenbo et al.

[11] Patent Number: 4,504,045
[45] Date of Patent: Mar. 12, 1985

[54] WAFER TRANSFORMING DEVICE

[75] Inventors: Yukio Kenbo; Nobuyuki Akiyama; Mitsuyoshi Koizumi, all of Yokohama; Asahiro Kuni, Tokyo, all of Japan

[73] Assignee: Hitachi, Ltd., Tokyo, Japan

[21] Appl. No.: 434,397

[22] Filed: Oct. 14, 1982

[30] Foreign Application Priority Data

Oct. 19, 1981 [JP] Japan ................................ 56-165772

[51] Int. Cl.$^3$ ............................................. B25B 11/00
[52] U.S. Cl. ........................................ 269/21; 269/22
[58] Field of Search ..................... 269/21, 22, 58, 903; 51/235; 294/64 R; 279/3; 204/297 R, 297 W, 297 M

[56] References Cited

U.S. PATENT DOCUMENTS 3,955,163  5/1976  Novak ................................... 269/21
4,391,511  7/1983  Akiyama et al. .
4,410,168 10/1983  Gotman ............................... 269/21
4,428,815  1/1984  Powell et al. ....................... 269/21

OTHER PUBLICATIONS

*IBM Technical Disclosure Bulletin*, vol. 15, No. 10, Mar. 1973, "Flatness Controlled Wafer Clamping Pedestal".

Primary Examiner—Robert C. Watson
Attorney, Agent, or Firm—Antonelli, Terry & Wands

[57] ABSTRACT

A wafer transforming device defines an airtight space by means of a base, a hollow case, and a diaphragm type chuck which is fixed to the upper end of the case by suction. In this space, a large number of vertically moving elements are arranged at predetermined intervals. In the state in which a wafer is held by suction by means of the chuck and in which the chuck is held in contact with the upper ends of the vertically moving elements by supplying a vacuum pressure into the space, the vertically moving elements located within a required range are selectively actuated. Thus, the chuck is pushed up, and the wafer held on the chuck by the suction is transformed into a desired state.

9 Claims, 6 Drawing Figures

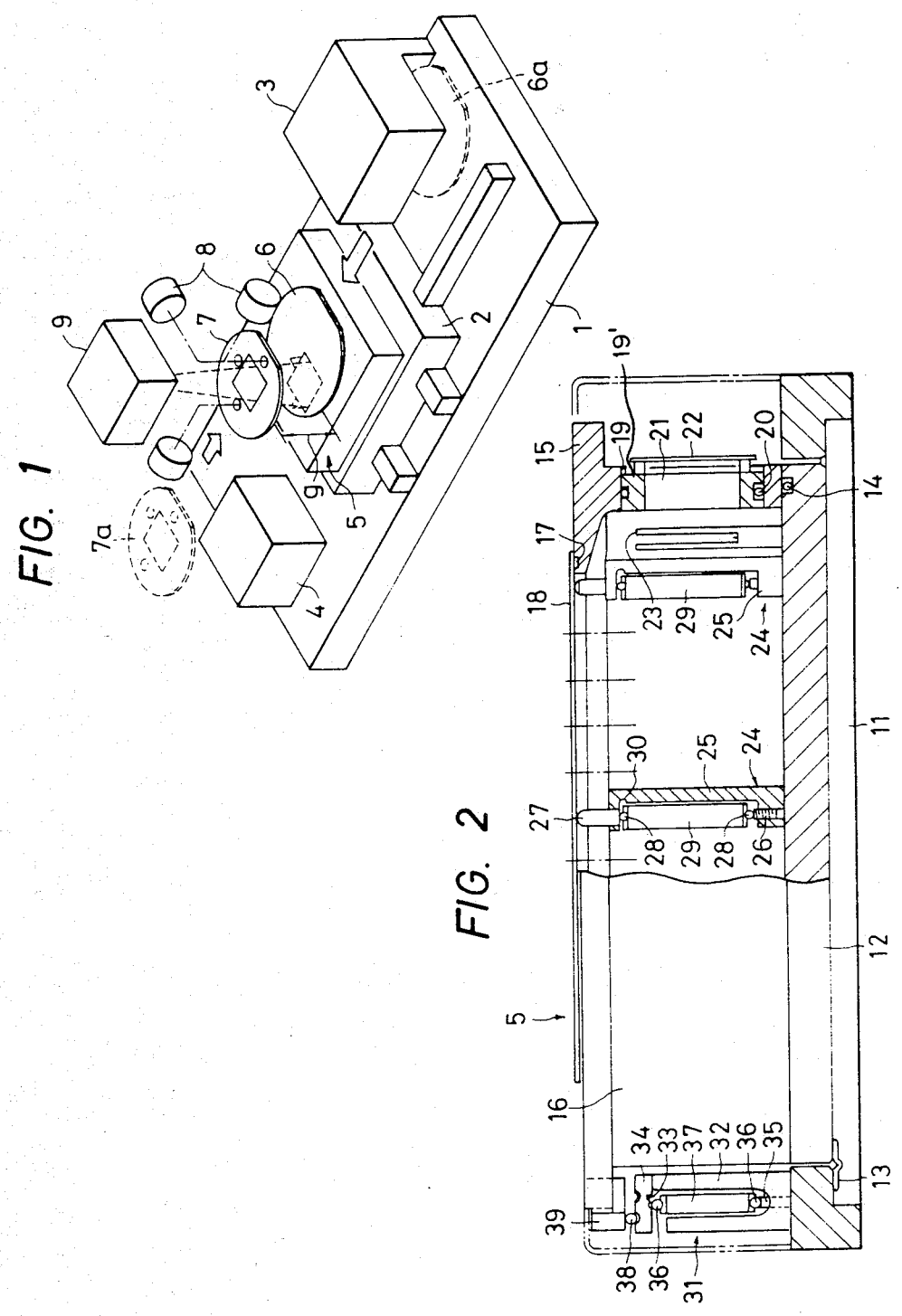

WAFER TRANSFORMING DEVICE

BACKGROUND OF THE INVENTION

The present invention relates to a wafer transforming device and, more particularly, to a device for transforming a base material according to the shape of a mask when a pattern, formed on the mask is to be transferred onto a resist film formed on the surface of the base material.

An IC (integrated circuit) or LSI (large-scale integrated circuit), for example, is manufactured with a required circuit arrangement by forming a resist film on a wafer made of silicon, transferring to the resist film a required pattern formed on a mask, and repeatedly performing the processing of etching, ion implantation, etc. according to the transferred pattern.

In, for example, the IC and the LSI, for enhancing a density of integration more, it is required to form a fine pattern in which the width of a line forming the circuit is 1 μm or less and, to met such requirement, it has been proposed to employ soft X-rays for the transfer of the pattern.

Several X-ray exposure apparatuses employing the soft X-rays; however, it is known that soft X-rays decay considerably in proceeding from a generation source to the resist film formed on the wafer. Therefore, various proposals have been made which include, for example, the measure of increasing the generation dose of the soft X-rays and the X-ray source, the measure of forming the mask by the use of a material which easily transmits the soft X-rays and also a maximum thinning of the mask.

When the mask is thinned, the mechanical strength of the mask lowers to such an extent that a large mask cannot be fabricated. Therefore, a step-and-repeat type transfer method has been proposed in which a mask corresponding to one LSI is prepared, and the wafers are moved one by one after the corresponding pattern has been transferred. However, when the mask is thin, it is difficult to flatten the mask.

On the other hand, the soft X-rays propagate rectilinearly while spreading radially from the generation source. In addition, the generation source of the soft X-rays has a size which corresponds to a diameter of an electron beam to irradiate an anode. Consequently, a deviation, corresponding to the size of the generation source, affects the arrival position of the soft X-rays which propagate from the generation source through the mask to the resist film on the wafer. This gives rise to defocusing, or a shift to a position somewhat deviating from a position directly under the mask pattern.

Moreover, the mask undergoes various unfavorable influences which include, for example, errors in fabrication of the mask, a distortion attributable to temperature rise at the exposure, a deformation attributable to chucking in the case of setting the mask on the exposure apparatus, a distortion attributable to the weight of the mask itself, and a distortion attributable to the difference between pressures acting on the upper and lower surfaces of the mask. When the mask is repeatedly used, it also undergoes a distortion ascribable to a change-with-time thereof. On the other hand, the wafer undergoes various unfavorable influences which include a deformation in the fabrication of the mask, a deformation attributable to chucking in the case of setting the wafer on the exposure apparatus, and deformations incurred in such processes as etching and ion implantation.

Accordingly, in order to transfer the circuit pattern of 1 μm or less, the surface part of the wafer to be exposed to the soft X-rays is required to be transformed so that the pattern projected from the mask can be received in the best condition.

In order to meet such requirement, an exposure device is proposed in, for example, IBM Technical Disclosure Bulletin, Vol. 15, No. 10, March 1973, entitled "Flatness Controlled Wafer Clamping Pedestal", wherein piezoelectric elements are arranged on the clamping pedestal formed with an opening for vacuum suction, with a wafer being placed on the pedestal and held in the vacuum suction, and, with a height of a plurality of points on the front surface of the wafer being detected by sensors. On the basis of the detected results, required voltages are applied to the piezoelectric elements, so as to push up the rear surface of the wafer so that the front surface of the water is made horizontal.

A disadvantage of this proposed device resides in the fact that, when the wafer is pushed up by the piezoelectric elements, a gap appears between the pedestal and the wafer resulting in a weakening of the vacuum force holding the wafer and the wafer is liable to slip due to air current flowing through the gap. Further, unless the piezoelectric elements are arranged uniformly over the whole area of the wafer, the wafer cannot be transformed to be horizontal or into a required shape. Therefore, for example, one hundred five piezoelectric elements are required, with the piezoelectric elements being arranged at intervals of 10 mm along the entire surface of a four-inch wafer, and one hundred forty-nine piezoelectric elements are required in a case of a five-inch wafer. Consequently, it is necessary to provide the same drive means for the piezoelectric elements and, since the drive means usually need to apply voltages of 0-650 V to the piezoelectric elements, it is technically difficult to provide a small side device. Since, it is technically difficult to furnish the exposure device with a large number of drive means, the device becomes unnecessarily large in size as well as relatively expensive.

An object of the present invention is to provide a wafer transforming device wherein there is no reduction in the force holding for the wafer, and therein the number of drive means for piezoelectric elements is equal to that of the piezoelectric elements to be actuated at one exposure, thereby permitting an exposure apparatus to be small in size and have an enhanced exposure precision.

In order to accomplish the object, according to the present invention, a diaphragm type chuck is arranged on the wafer placing surface of a chuck case, with the lower surface of the chuck being supported by a large number of vertically moving elements and held in vacuum suction so as to be in close contact with the upper ends of the vertically moving elements, and with the vertically moving elements lying in an exposure region and surrounding area thereof being switched and connected to a drive means.

BRIEF DESCRIPTION OF THE DRAWINGS

FIG. 1 is a perspective view of an X-ray exposure apparatus to which a wafer transforming device of the present invention is applied;

FIG. 2 is a partial cross-sectional front view of an embodiment of the wafer transforming device according to the present invention;

DESCRIPTION OF THE PREFERRED EMBODIMENT

Figure 3:
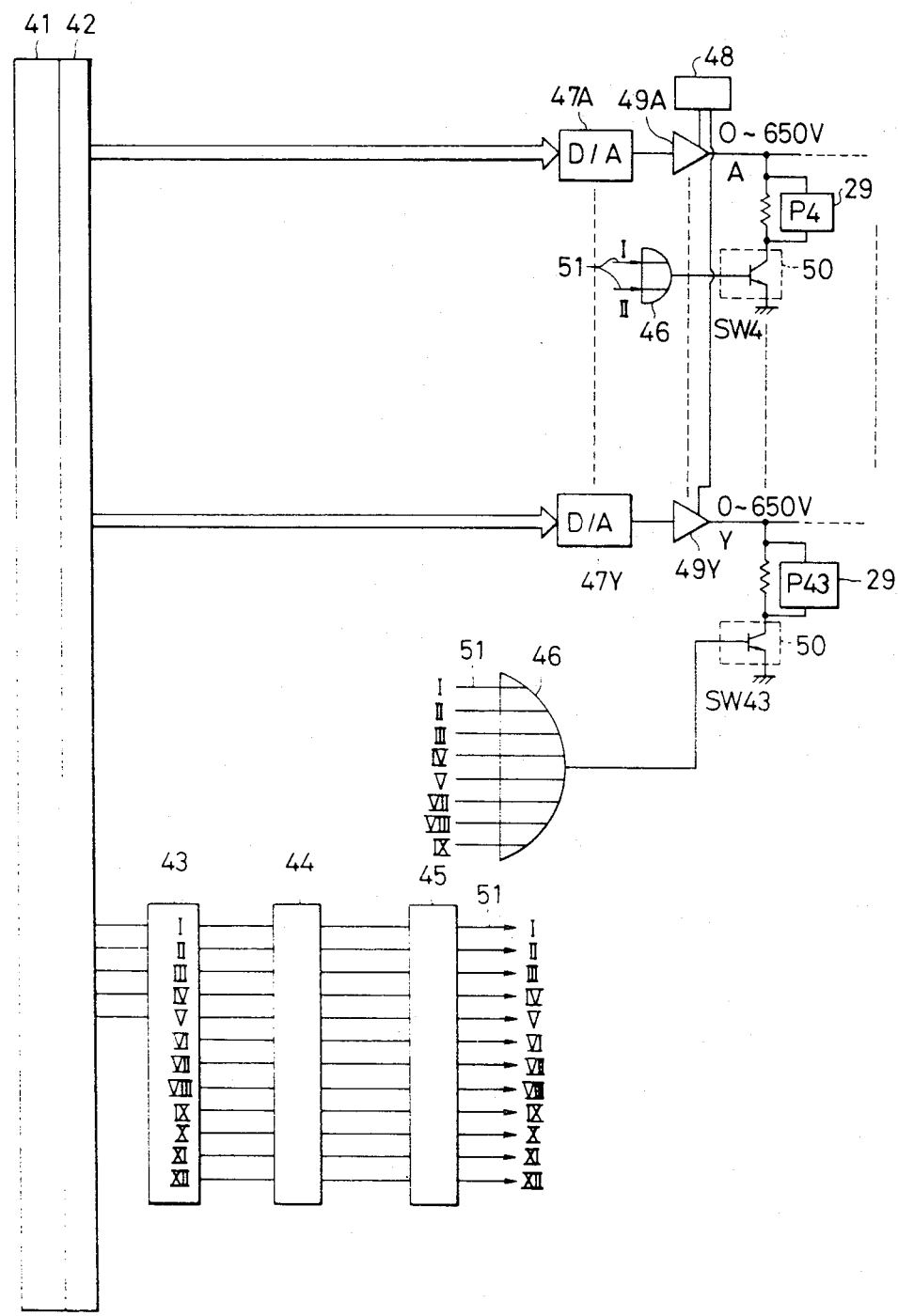
FIG. 3 is a block diagram of driving circuits for the wafer transforming device shown in FIG. 2.

Referring now to the drawings wherein like reference numerals are used throughout the various views to designate like parts and, more particularly, to FIG. 1, according to this figure, an X-Y table 2 is arranged centrally on a base 1, and a wafer flatness detector 3 and a mask flatness detector 4 are arranged on both the sides thereof. A wafer transforming device generally designated by the reference numeral 5 is arranged on the X-Y table 2, and a wafer 6 whose flatness has been detected is placed and fixed on the transforming device 5. A mask 7, whose flatness has been detected, is arranged over the wafer 6 in a manner to oppose to the wafer 6 with a minute gap g therebetween. Alignment detectors 8 are arranged over the mask 7. In interlocking with the outputs of the alignment detectors 8, the X-Y table 2 moves to execute the positioning between the mask 7 and the wafer 6. When the positioning between the mask 7 and the wafer 6 has ended, the wafer transforming device 5 operates to transform the wafer 6 into a required shape. Further, a soft X-ray generator 9 is disposed over the mask 7 in such a manner that soft X-rays produced by the generator 9 are projected on the wafer 6 through the mask 7. At this time, when a resist film reacting with the soft X-rays is formed on the wafer 6, a pattern formed on the mask 7 can be transferred onto the resist film.

As shown in FIG. 2, the wafer transforming device 5 includes an annular stationary base 11 placed and fixed on the X-Y table, with a base 12, lying centrally of the base 11, being coupled to the stationary base 11 by three leaf springs 13 arranged at intervals of 120 degrees. An annular groove is formed in the upper part of the base 12, and an O-ring 14 is installed therein. A hollow case 16, formed with an annular flange 15 at its upper end, is placed and fixed on the O-ring 14 so as to form an air tight seal between the base 12 and the case 16. An annular groove 17 for vacuum suction is formed on the inner peripheral edge side of the upper end face of the flange 15 with a diaphragm type chuck 18, disposed on the flange 15 in a manner so as to cover the groove 17, being fixed by suction due to a vacuum established in the groove 17. A shallow groove is formed in the upper surface of the chuck 18 by etching or the like, and the wafer is chucked by vacuum suction through this groove. A penetrating hole 19 is formed in the side surface of the case 16. An annular frame 19' is disposed in the penetrating hole 19, with the frame 19' being formed with a groove in an outer periphery thereof for accommodating an O-ring 20 so as to form an air tight seal between the case 16 and the frame 19' when the frame 19' is mounted on the case 16. A plurality of pipes (not shown) and a plurality of wiring leads (not shown) extend through central part of the frame 19', with the pipes serving to supply a vacuum pressure to a space defined by the base 12, case 16 and chuck 18, and also to the groove 17 and the groove of the surface of the chuck 18 through the aforementioned space, while the wiring leads serve to apply voltages to piezoelectric elements to be described more fully hereinbelow. The remaining space of the frame 19' is filled up with a filler 21 for maintaining an airtight condition, with a bracket 22 for supporting the pipes and the wiring leads being fixed to the outer side surface of the frame 19' and a bracket 23, for supporting the pipes and the wiring leads, being mounted on the base 12 at a position inside the frame 19'. A large number of vertically moving elements 24 are arranged on the base 12 in a predetermined array. With, for example, a four inch wafer, one hundred five vertically moving elements 24 numbers are arranged on the whole surface of the wafer at intervals of 10 mm. Each of the vertically moving elements 24 includes a channeled case 25 fixed to the base 12, an adjusting screw 26 threadably engaged in a screw hole formed in the lower end of the case 25, a chip 27 for taking out a displacement value, with the chip 27 being threadably engaged in a screw hole formed in the upper end of the case 25. A piezoelectric element 29 is supported between a pair of steel balls 28 respectively lying in contact with the screw 26 and the chip 27. A notch 30 is formed in the upper part of the case 25 so as to facilitate the elastic deformation of the upper end of the case 25, with the piezoelectric element 29 being connected to the wiring leads. Three vertically moving elements 31 are arranged on the stationary base 11 at intervals of 120 degrees in correspondence with the leaf springs 13. Each of the vertically moving elements 31 includes a U-shaped case 32, fixed to the stationary base 11, a chip 34, for taking out a displacement value, with the chip 34 having one end fixed to the upper end of the case 32 and being formed so as to be elastically deformable due to to a notch 33. An adjusting screw 35 is held in threadable engagement with a screw hole formed in the lower end of the case 32, and a piezoelectric element 37 is supported between the chip 34 and the screw 35 through a pair of steel balls 36. The chip 34 carries a bracket 39 arranged on the flange 15 of the case 16, by a steel ball 38 placed on the upper surface thereof, whereby the case 16 is supported. Accordingly, when the vertically moving elements 31 operate, the inclination of the whole chuck 18 can be changed, an so that an exposure surface of the wafer is leveled, when the vacuum pressure is supplied to the space defined by the base 12, case 16 and chuck 18, the chuck 18 is depressed by the atmospheric pressure until it comes into contact with the chips 27 of the vertically moving elements 24. Thus, the chuck 18 is supported by the vertically moving elements 24. Accordingly, when the wafer 6 is supported on the chuck 18 by suction, it is also transformed after the chuck 18.

As shown in FIG. 3, a driver circuit for the vertically moving elements 24 includes a CPU 41 in FIG. 3 connected to the wafer flatness detector 3 and the mask flatness detector 4 shown in, with the CPU 41 storing the detection data of the respective detectors 3 and 4. The deformation values of the wafer 6 are determined by the vertically moving elements 24, that is, the voltages to be applied to the piezoelectric elements 29 of the vertically moving elements 24. On the basis of a command of the CPU 41, an output port 42 connected to the CPU 41 provides selection signals for the vertically moving elements 24 to be operated and the digital values of the voltages to be applied to the respective vertically moving elements 24. On the basis of the selection signals applied from the output port 42, a decoder 43 connected to the output port 42 generates signals for assigning sections (12 divisions in the embodiment) which are previously set in correspondence with the step-and-repeat movements of X-Y table 2. A latch circuit 44, connected to the decoder 43, latches the signals delivered from the decoder 43. In response to signals applied from the latch circuit 44, a buffer circuit 45, connected to the latch circuit 44, applies actuating signals to the switching circuits (to be described below) of the piezoelectric elements 29 to be actuated, through OR circuits 46. On the other hand, twenty-five digital-to-analog converters 47A–47Y connected to the output port 42 are supplied with the digital signals based on the calculated results of the CPU 41. Twenty-five amplifiers 49A–49Y connected to a high voltage source 48 and the D/A converters 47A–47Y derive required voltages from a voltage supplied from the high voltage source 48, on the basis of analog signals delivered from the D/A converters 47A–47Y. The piezoelectric element 29, and the switching circuit 50 formed of a transistor connected to this piezoelectric element are connected in parallel with each of the amplifiers 49A–49Y. The switching circuits 50 are supplied with the actuating signals 51 generated from the buffer circuit 45. When the switching circuits 50 supplied with the actuating signals 51 have operated, the piezoelectric elements 29 connected to these switching circuits are supplied with the voltages from the amplifiers 49A–49Y.

Figure 4:
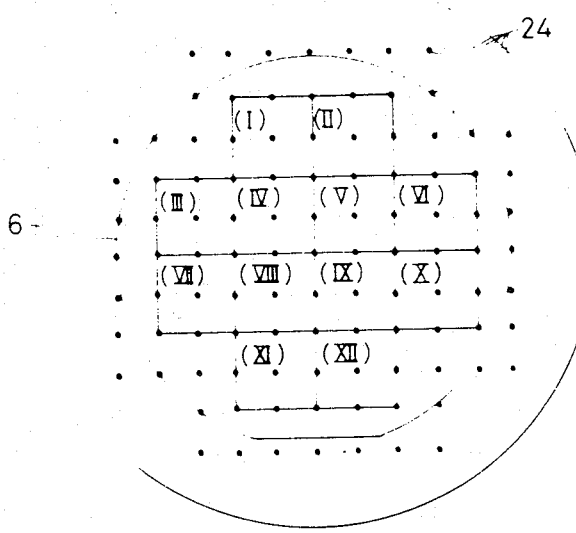
FIG. 4 is a plan view showing the positional relationship between a wafer and vertically moving elements.

With, for example, the wafer 6 carried on the chuck 18 divided into the twelve sections (I)–(XII) shown in FIG. 4 and then exposed to the soft X-rays, the vertically moving elements 24 are arranged underneath the chuck 18. At one exposure, as to each of the exposure ranges (I)–(XII), the twenty-five vertically moving elements 24 in and around the particular exposure range are actuated so as to prevent the transformed state of this exposure range from being affected by untransformed parts in the surrounding.

Figure 5:
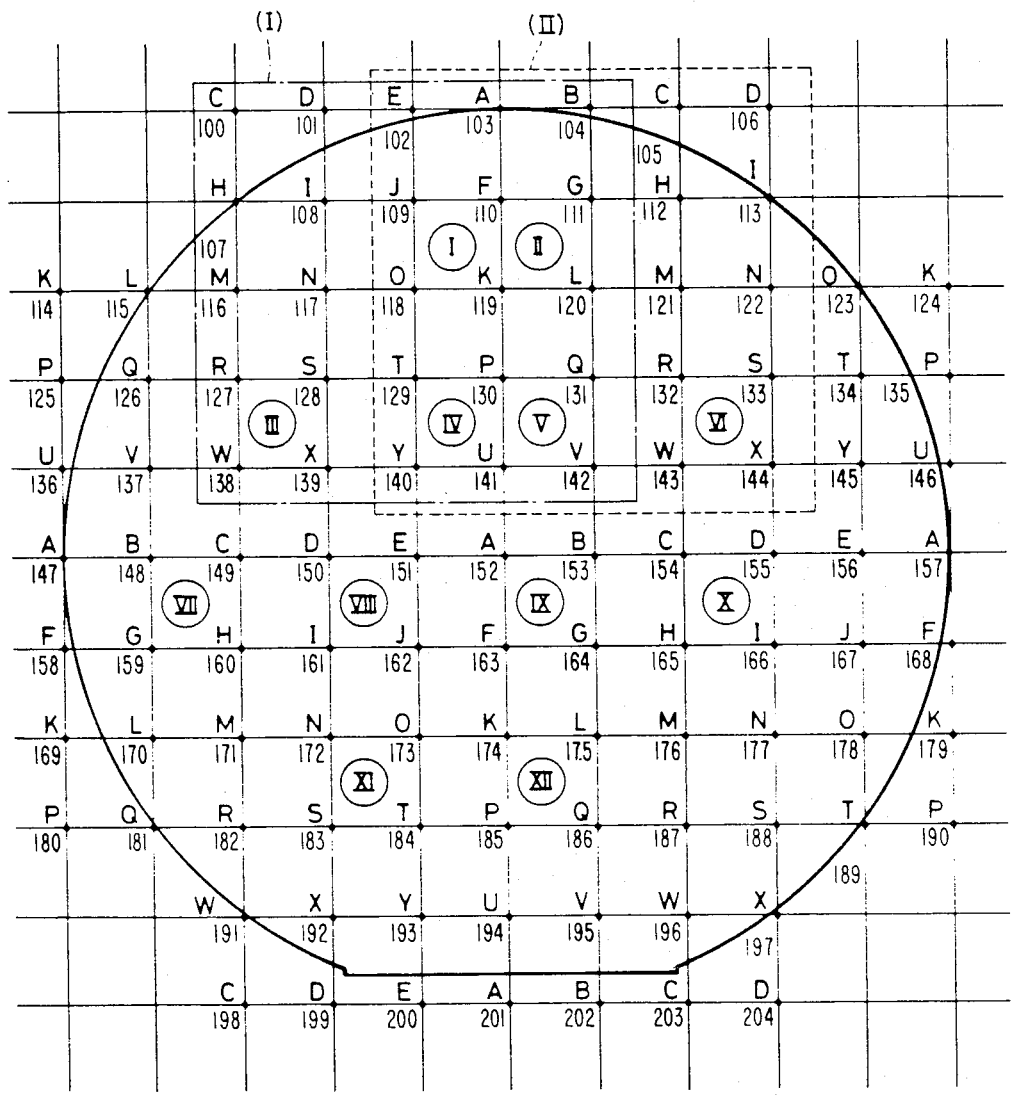
FIG. 5 is a plan view showing the correspondence between the vertically moving elements and the driving circuits thereof.
Figure 6:
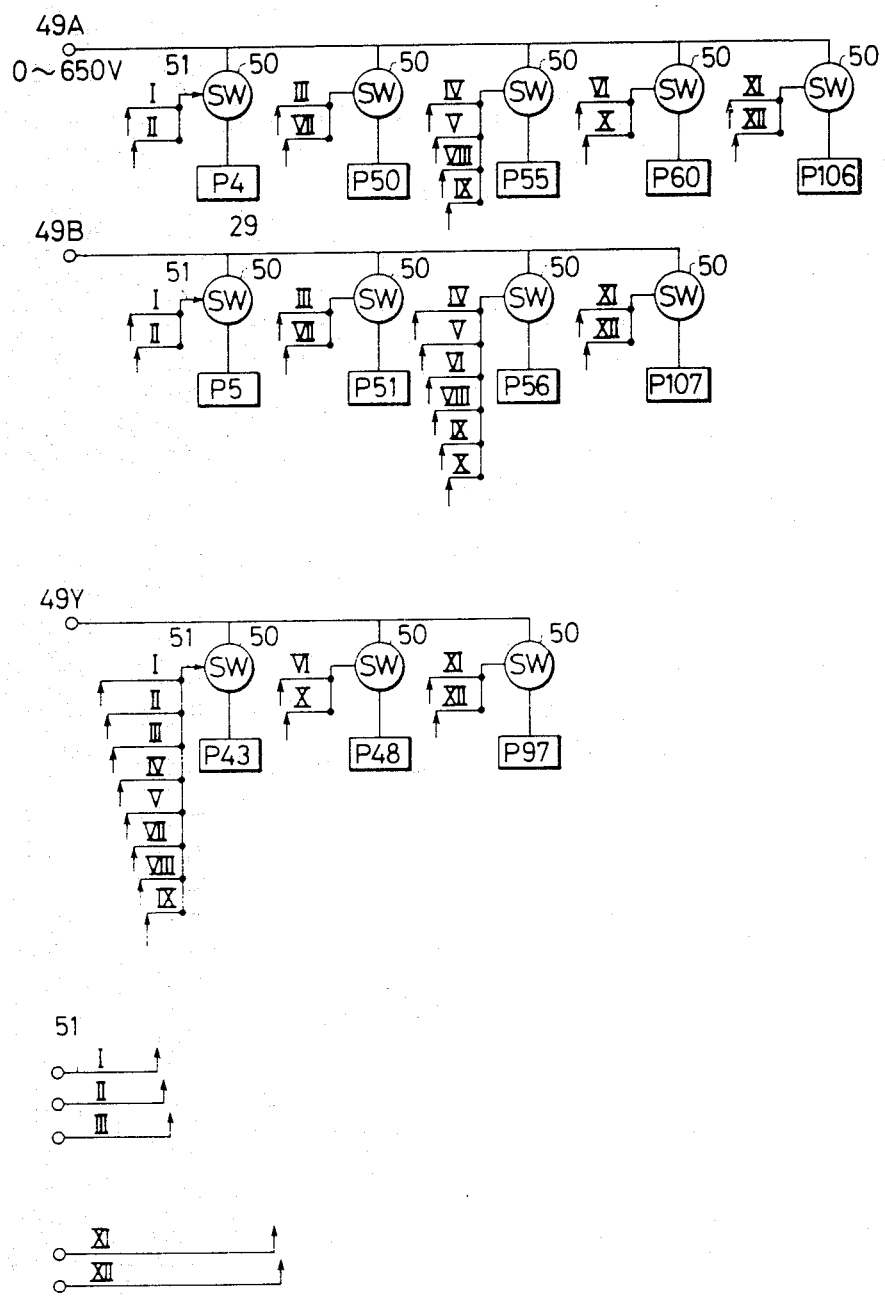
FIG. 6 is a model diagram showing the correspondence between the vertically moving elements and the driving circuits thereof.

FIG. 5 provides an illustration of the one-hundred-and-five vertically moving elements 24, and the twenty-five amplifiers 49A–49Y for driving them correspond as shown in FIG. 5. More specifically, the one hundred five vertically moving elements 24 are respectively indicated by numerals 100–204 and the twenty-five amplifiers 49A–49Y are designated by letters A–Y, the vertically moving element 100 is driven by the amplifier C in case of the section (I). Likewise, the vertically moving element 101 is driven by the amplifier D, and the corresponding relations of 102-E, 103-A, 105-B, 107-H, 108-I, . . . 141-U, and 142-V hold. In case of the section (II), the corresponding relations of 102-E, 103-A, 104-B, 105-C, 106-D, 109-J, 110-F, . . . , 143-W, and 144-X hold. As shown in FIG. 6, the generation of the actuating signal 51 of the amplifier I from the buffer 45 results in actuating the fourth piezoelectric element 29 (P4) of the vertically moving element 24 connected to the amplifier 49A, the fifth piezoelectric element 29 (P5) of the vertically moving element 24 connected to the amplifier 49B, . . . , and the forty-third piezoelectric element 29 (P43) of the vertically moving element 24 connected to the amplifier 49Y.

In this way, when the CPU 41 has generated the section assignment signal and the digital signals of the voltages to be provided from the respective amplifiers 49A–49Y in the particular section, the twenty-five vertically moving elements 24 in the exposure region and the surrounding thereof are actuated, whereby the exposure region of the wafer 6 can be transformed into a required shape.

The vertically moving elements 31 function when the entire wafer 6 is slanted, to render the entire wafer horizontal in such a way that one or two of these elements 31 are actuated. The drive of the elements 31 may be effected by a command of the CPU 41 likewise to that of the vertically moving elements 24.

We claim:

1. A wafer transforming device wherein a wafer carried by vacuum sunction is transformed by pushing it up from a suction surface side thereof, the wafer transforming device comprising:
   a base,
   a hollow case supported by said base,
   a diaphragm type chuck supported at an upper end of said case and having an upper surface formed with a suction groove,
   a large number of vertically moving elements which are arranged at predetermined intervals in predetermined positions within an airtight space that is defined by said base, said case and said chuck, and
   drive means for selectively actuating the vertically moving elements.

2. A wafer transforming device according to claim 1, wherein said each vertically moving element comprises:
   a piezoelectric element,
   a case attached to said piezoelectric element and having an upper elastically deformable end part, and
   a chip means for transmitting a displacement of the upper end part of the chuck, said chip means being fixed to an upper end of said case and an upper end thereof lying in contact with a lower surface of said chuck.

3. A wafer transforming device according to claim 1, further comprising an annular stationary base arranged outside the first-mentioned base, three vertically moving elements arranged on three places of said stationary base and supporting said case, and leaf springs for coupling said stationary base and said first-mentioned base.

4. An exposure apparatus for exposing a circuit pattern of a mask and a wafer, the exposure apparatus comprising:
   a wafer transforming device for holding a wafer by a vacuum suction applied to a back surface of the wafer until a surface contour thereof corresponds to a contour of the image surface, said wafer transforming device comprising a base, a hollow case supported by said base, a suction chuck means supported in an upper end of said case, and a large number of vertically moving elements arranged at predetermined intervals in said hollow case, and wherein drive means are provided for selectively actuating the vertically moving elements according to changing exposure areas on the wafer.

5. An exposure apparatus according to claim 4, wherein each of said vertically moving elements comprises a piezoelectric element, a case member is attached to said piezoelectric element, said case member having an elastically deformable upper end part, and wherein means are provided for transmitting a displacement of said upper end part to the suction chuck means.

6. An exposure apparatus according to claim 5, further comprising an annular stationary base, at least three vertically moving elements are arranged on at least three portions of said stationary base, and wherein coupling means are provided for coupling said stationary base and said first mentioned base so as to produce a relative displacement therebetween in a vertical direction.

7. An exposure apparatus according to claim 6, wherein said coupling means comprises leaf spring means.

8. An exposure apparatus according to claim 4, further comprising a table means for supporting said wafer and means for moving the table so as to carry out a step and repeat movement to change exposure areas of the wafer.

9. An exposure apparatus according to claim 4, wherein said drive means comprises an amplifier means connected to a drive source, and switching means for changing an output of said amplifier means to the vertically moving elements for selectively actuating the vertically moving elements.

* * * * *